(12) United States Patent
Lai et al.

(10) Patent No.: US 10,056,256 B2
(45) Date of Patent: Aug. 21, 2018

(54) METHOD OF PRIMING PHOTORESIST BEFORE APPLICATION OF A SHRINK MATERIAL IN A LITHOGRAPHY PROCESS

(71) Applicant: TAIWAN SEMICONDUCTOR MANUFACTURING CO., LTD., Hsin-Chu (TW)

(72) Inventors: Wei-Han Lai, Taipei (TW); Ching-Yu Chang, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/071,243

(22) Filed: Mar. 16, 2016

(65) Prior Publication Data

US 2017/0271155 A1    Sep. 21, 2017

(51) Int. Cl.
| | |
|---|---|
| H01L 21/311 | (2006.01) |
| H01L 21/033 | (2006.01) |
| G03F 7/40 | (2006.01) |
| G03F 7/20 | (2006.01) |
| G03F 7/32 | (2006.01) |
| G03F 7/38 | (2006.01) |
| H01L 21/027 | (2006.01) |

(52) U.S. Cl.
CPC ............ *H01L 21/0337* (2013.01); *G03F 7/20* (2013.01); *G03F 7/32* (2013.01); *G03F 7/38* (2013.01); *G03F 7/405* (2013.01); *H01L 21/0274* (2013.01); *H01L 21/31144* (2013.01)

(58) Field of Classification Search
None
See application file for complete search history.

(56) References Cited

U.S. PATENT DOCUMENTS

| | | | |
|---|---|---|---|
| 8,216,767 | B2 | 7/2012 | Wang et al. |
| 8,323,870 | B2 | 12/2012 | Lee et al. |
| 8,580,117 | B2 | 11/2013 | Kao et al. |

(Continued)

OTHER PUBLICATIONS

Rosamonte's Physical Chemistry Website; https://physicalchemistryrosamonte.wordpress.com/material-balances/material-balances-on-a-crystallizer/physical-properties-of-pure-methanol/dipole-moment/; Aug. 4, 2017.*

(Continued)

*Primary Examiner* — Shamim Ahmed
(74) *Attorney, Agent, or Firm* — Haynes and Boone, LLP

(57) ABSTRACT

A photoresist layer is formed over a patternable layer. The photoresist layer containing a negative tone photoresist material. An exposure process is performed to the photoresist layer. A post-exposure bake (PEB) process is performed to the photoresist layer. The photoresist layer is rinsed to develop a photoresist pattern. A primer material is applied to the photoresist pattern. The primer material is configured to: straighten a profile of the photoresist pattern, or to increase a number of deprotected acid labile group (ALG) units of the photoresist material, or to bond with the deprotected ALG units of the photoresist material. After the primer material is applied, the photoresist pattern is enlarged by coating a shrink material over the photoresist pattern, baking the shrink material, and removing portions of the shrink material. The patternable layer is patterned using the enlarged photoresist pattern as a mask.

20 Claims, 21 Drawing Sheets

(56) References Cited

U.S. PATENT DOCUMENTS

| | | | |
|---|---|---|---|
| 8,658,344 B2 | 2/2014 | Wang et al. | |
| 8,715,919 B2 | 5/2014 | Chang et al. | |
| 8,741,551 B2 | 6/2014 | Wu et al. | |
| 2004/0166447 A1* | 8/2004 | Chang | G03F 7/40 430/324 |
| 2005/0009365 A1* | 1/2005 | Sugeta | G03F 7/40 438/781 |
| 2008/0166664 A1* | 7/2008 | Nomura | G03F 7/40 430/311 |
| 2012/0238095 A1* | 9/2012 | Ogihara | C08L 83/04 438/694 |
| 2013/0323641 A1* | 12/2013 | Chang | G03F 7/0045 430/270.1 |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1* | 7/2014 | Chang | G03F 7/20 430/322 |
| 2014/0187027 A1* | 7/2014 | Xu | H01L 21/266 438/530 |
| 2014/0255850 A1 | 9/2014 | Chang et al. | |
| 2014/0256146 A1* | 9/2014 | Chien | H01L 21/3086 438/703 |
| 2014/0272709 A1 | 9/2014 | Liu et al. | |
| 2014/0272726 A1 | 9/2014 | Chang | |
| 2014/0273521 A1 | 9/2014 | Wu et al. | |
| 2014/0363958 A1* | 12/2014 | Hatakeyama | G03F 7/094 438/514 |
| 2015/0118852 A1* | 4/2015 | Lee | H01L 21/0273 438/703 |
| 2015/0177615 A1* | 6/2015 | Jain | G03F 7/0045 430/285.1 |
| 2016/0062232 A1* | 3/2016 | Hong | H01L 21/0273 430/325 |
| 2016/0187782 A1* | 6/2016 | Hustad | H01L 21/0274 438/703 |
| 2016/0202612 A1* | 7/2016 | Hatakeyama | G03F 7/40 430/296 |
| 2016/0342091 A1* | 11/2016 | Lin | G03F 7/327 |
| 2017/0170008 A1* | 6/2017 | Park | C09D 125/08 |

OTHER PUBLICATIONS

Yoshihiro Miyamoto et al. "Advanced Shrink Material for NTD Process with Lower Y/X Shrinkage Bias of Elongated Patterns" Advances in Patterning Materials and Processes XXXII, Proc. of SPIE vol. 9425, 942520, http://proceedings.spiedigitallibrary.org/, 2015, 6 pages.

Yoshihiro Miyamoto et al. "Chemical Shrink Materials and Process for Negative Tone Development (NTD) Resist" Advances in Patterning Materials and Processes XXXI, Proc. of SPIE vol. 9051, 905123, http://proceedings.spiedigitallibrary.org/, 2014, 7 pages.

Wei-Han Lai et al. "Novel Chemical Treatment for Lithography Improvement in a Negative Tone Development Process" U.S. Appl. No. 14/658,354, filed Mar. 16, 2015, 24 pages.

* cited by examiner

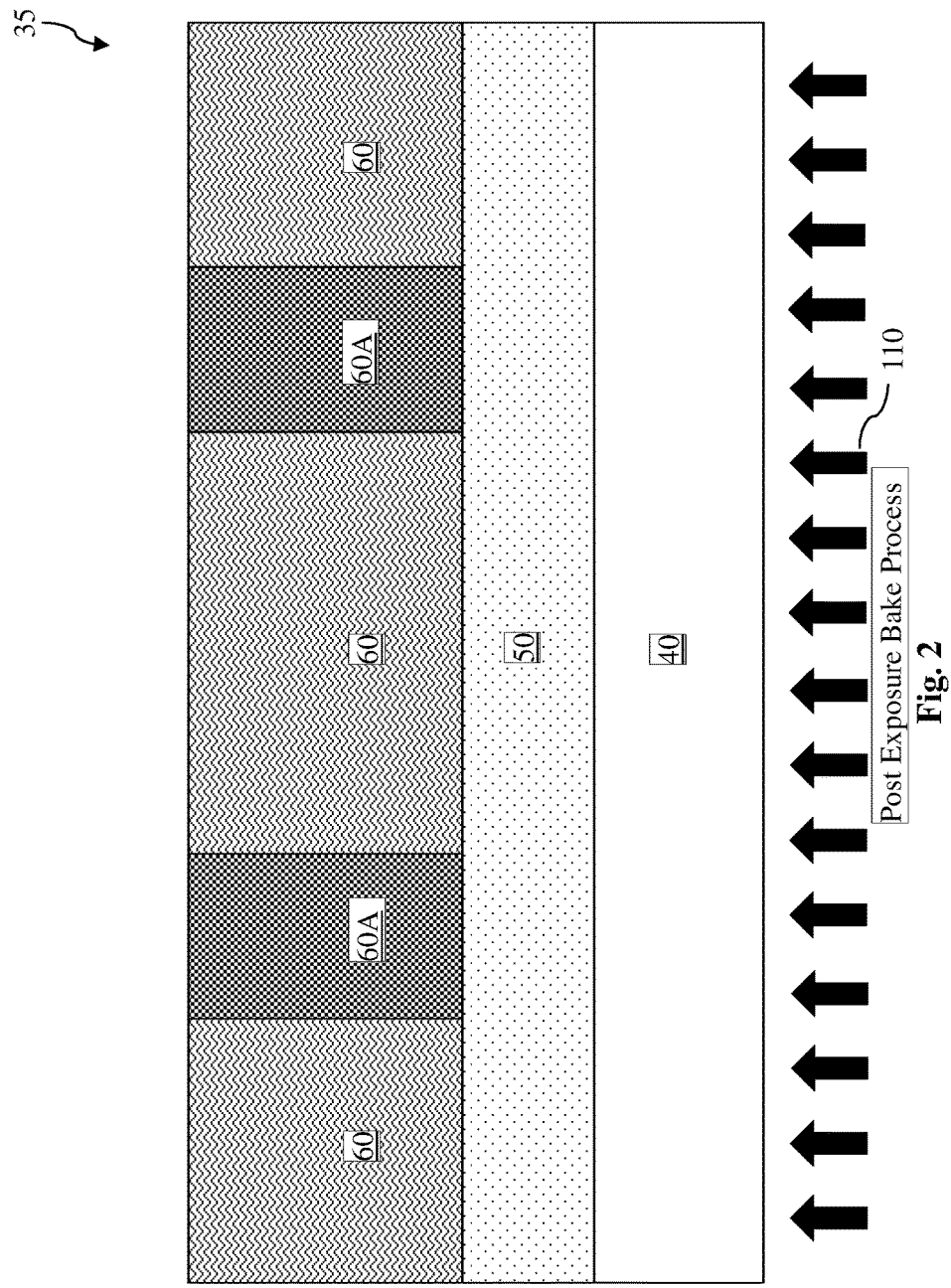

METHOD OF PRIMING PHOTORESIST BEFORE APPLICATION OF A SHRINK MATERIAL IN A LITHOGRAPHY PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. To achieve smaller dimensions, a shrink material may be applied on photoresist patterns to reduce the dimensions between adjacent photoresist patterns. However, the reductions of these dimensions may be affected by different profiles of the developed photoresist patterns, or by the number of deprotected acid labile group (ALG) units of the photoresist patterns. As a result, the use of shrink material may not bring about the desired reduction in device dimensions.

Therefore, while existing photolithography processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1-2, 3A, 3B, 3C, 4A, 4B, 4C, 5A, 5B, 5C, 6, 7A, 7B, 8-11 and 13 are diagrammatic cross-sectional side views of a semiconductor device at various stages of fabrication in accordance with some embodiments of the present disclosure.

DETAILED DESCRIPTION

Figure 1:
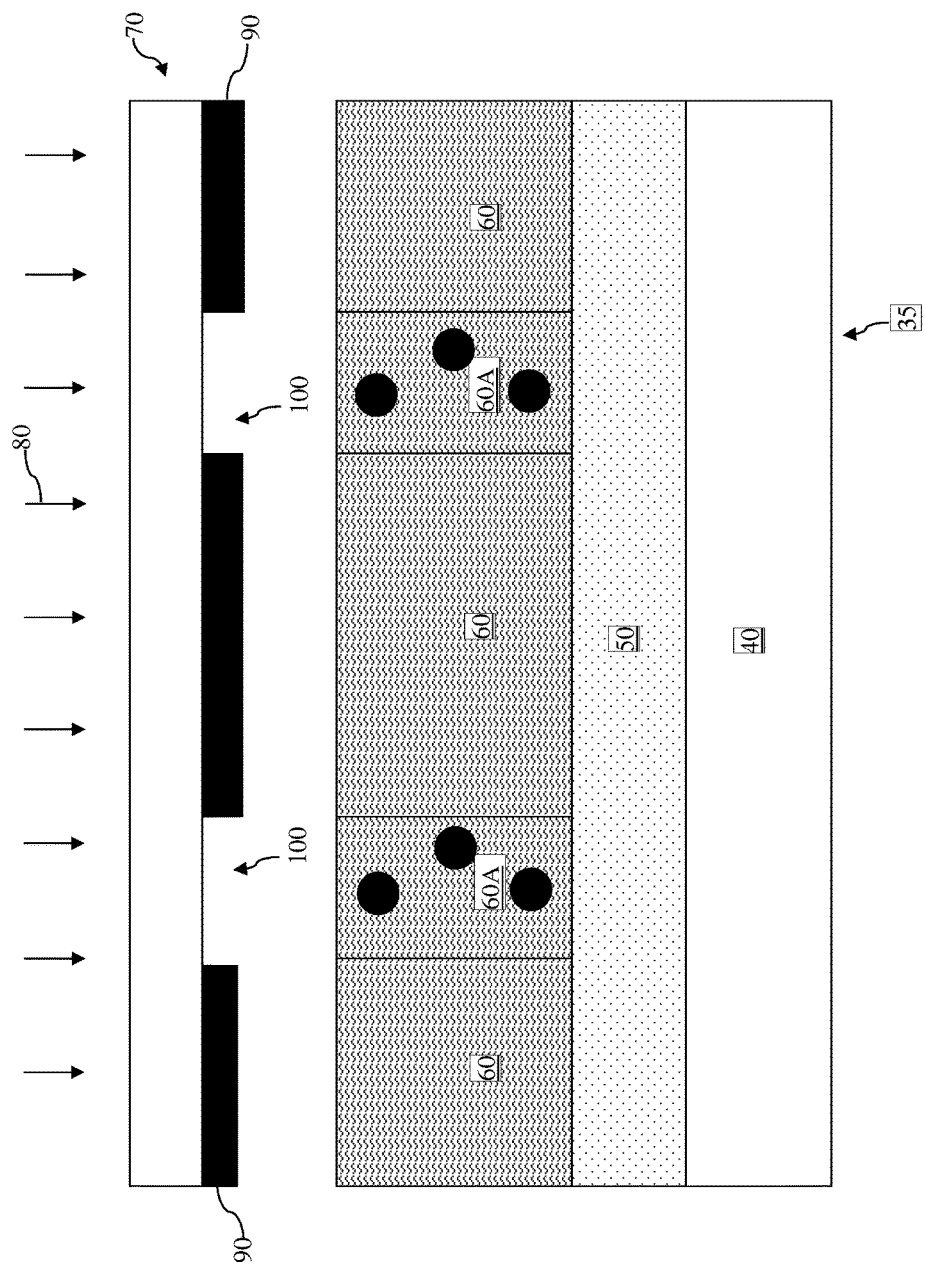

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor industry progresses to smaller and smaller technology nodes, various fabrication techniques have been employed to achieve the increasingly small device sizes. For example, a shrink material (also interchangeably referred to as a shrinkage material hereinafter) may be applied to the developed photoresist patterns. In response to a baking process, the shrink material interacts with the photoresist patterns, thereby making the photoresist patterns larger (e.g., a wider width) and reducing the lateral dimensions between adjacent photoresist patterns. This may be referred to as a "shrink" process, since it is shrinking the lateral dimension between photoresist patterns. The reduction in the lateral dimensions as a result of the shrink process may allow the subsequent formation of smaller features such as contact holes/trenches. However, existing shrink processes may still suffer from shortcomings such as non-uniform or inadequate shrinking of the lateral dimension between photoresist patterns. These problems may be caused by the non-uniform profiles of the photoresist pattern, or by the different surface characteristics of the photoresist patterns.

To overcome these issues associated with the shrink process discussed above, the present disclosure coats a primer material on the photoresist before the application of the shrink material. The various aspects of the present disclosure will be discussed below in greater detail with reference to FIGS. 1-2, 3A, 3B, 3C, 4A, 4B, 4C, 5A, 5B, 5C, 6, 7A, 7B, 8-14.

FIGS. 1-2, 3A-3C, 4A-4C, 5A-5C, 6, 7A-7B, 8-11 and 13 are diagrammatic fragmentary cross-sectional side views of a semiconductor device 35 at various stages of fabrication in accordance with various aspects of the present disclosure. The semiconductor device 35 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 1, a semiconductor device 35 includes a substrate 40. In some embodiments, the substrate 40 is a silicon substrate doped with a p-type dopant such as boron (for example a p-type substrate). Alternatively, the substrate 40 could be another suitable semiconductor material. For example, the substrate 40 may be a silicon substrate that is doped with an n-type dopant such as phosphorous or arsenic (an n-type substrate). The substrate 40 could include other elementary semiconductors such as germanium and diamond. The substrate 40 could optionally include a compound semiconductor and/or an alloy semiconductor. Further, the substrate 40 could include an epitaxial layer (epi layer), may be strained for performance enhancement, and may include a silicon-on-insulator (SOI) structure.

In some embodiments, the substrate 40 is substantially conductive or semi-conductive. The electrical resistance may be less than about $10^3$ ohm-meter. In some embodiments, the substrate 40 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 40 may contain Ti, Al, Co, Ru, TiN, WN2, or TaN.

In some other embodiments, the substrate 40 contains a dielectric material with a dielectric constant in a range from about 1 to about 40. In some other embodiments, the substrate 40 contains Si, metal oxide, or metal nitride, where the formula is MXb, wherein M is a metal or Si, and X is N or O, and wherein "b" is in a range from about 0.4 to 2.5. For example, the substrate 40 may contain $SiO_2$, silicon nitride, aluminum oxide, hafnium oxide, or lanthanum oxide.

A material layer 50 is formed over the substrate 40. The material layer 50 can be patterned via a lithography process and as such may also be referred to as a patternable layer. It is understood that the material layer 50 may serve as a hard mask, which can be used to pattern layers underneath after its own pattern has been defined by a patterned photoresist (to be formed thereabove). Thus, the material layer 50 may be referred to as a Si hard mask (Si-HM). In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises at least one of different polymer structure, acid labile molecule, PAG (photo acid generator) loading, quencher loading, chromophore, cross linker, or solvent, which lead to different n value to photoresist. In some embodiments, the material layer 50 and photoresist have different etching resistance. In some embodiments, the material layer 50 contains an etching resistant molecule. The molecule includes low onishi number structure, double bond, triple bond, silicon, silicon nitride, Ti, TiN, Al, aluminum oxide, SiON, or combinations thereof.

It is understood that the substrate 40 and the material layer 50 may each include additional suitable material compositions in other embodiments. It is also understood that additional layers may be formed between the substrate 40 and the material layer 50, but they are not illustrated herein for reasons of simplicity.

A photoresist layer 60 is formed over the material layer 50. In some embodiments, the photoresist layer 60 includes a negative tone photoresist (also referred to as negative photoresist). Compared to a positive tone photoresist, where the portion of the photoresist exposed to light becomes soluble to a developer solution, the portions of the negative tone photoresist exposed to light remains insoluble to the developer solution. The photoresist layer 60 may be formed by a spin-coating process. The photoresist layer 60 may contain components such as a polymer, photo acid generators (PAG), solvent, quenchers, chromophore, surfactant, cross linker, etc.

An exposure process is performed to expose desired portions of the photoresist layer 60. As a part of the exposure process, a photomask 70 (or a reticle) is positioned above the photoresist layer 60. As an illumination source, radiation such as ultraviolet (UV) light 80 is projected toward the photomask 70 from above. In some embodiments, the UV light has an illumination wavelength substantially less than 250 nm and comprises at least one of: KrF, ArF, EUV, or E-beam.

The photomask 70 has opaque portions 90, which will block radiation such as the UV light 80. Between the opaque portions 90 are transparent regions 100, which allow the UV light 80 to propagate through toward the photoresist layer 60 and expose the portions 60A of the photoresist layer 60 underneath. As a result of the UV light exposure, the portions 60A become crosslinked/polymerized and more difficult to dissolve in a developer solution.

Referring now to FIG. 2, a post exposure bake process 110 is performed to the semiconductor device 35 after the exposure process discussed above with reference to FIG. 1. In some embodiments, the post exposure bake process 110 may be performed at a temperature range between about 100 degrees Celsius and about 120 degrees Celsius for several minutes. The post exposure bake process 110 catalytically performs and completes the photo reaction initiated inside the photoresist layer 60 during the exposure process. The post exposure bake process 110 also helps remove solvent from the photoresist layer 60. As a result, the adhesion and etching resistance of the photoresist layer 60 are improved.

Figure 3A:
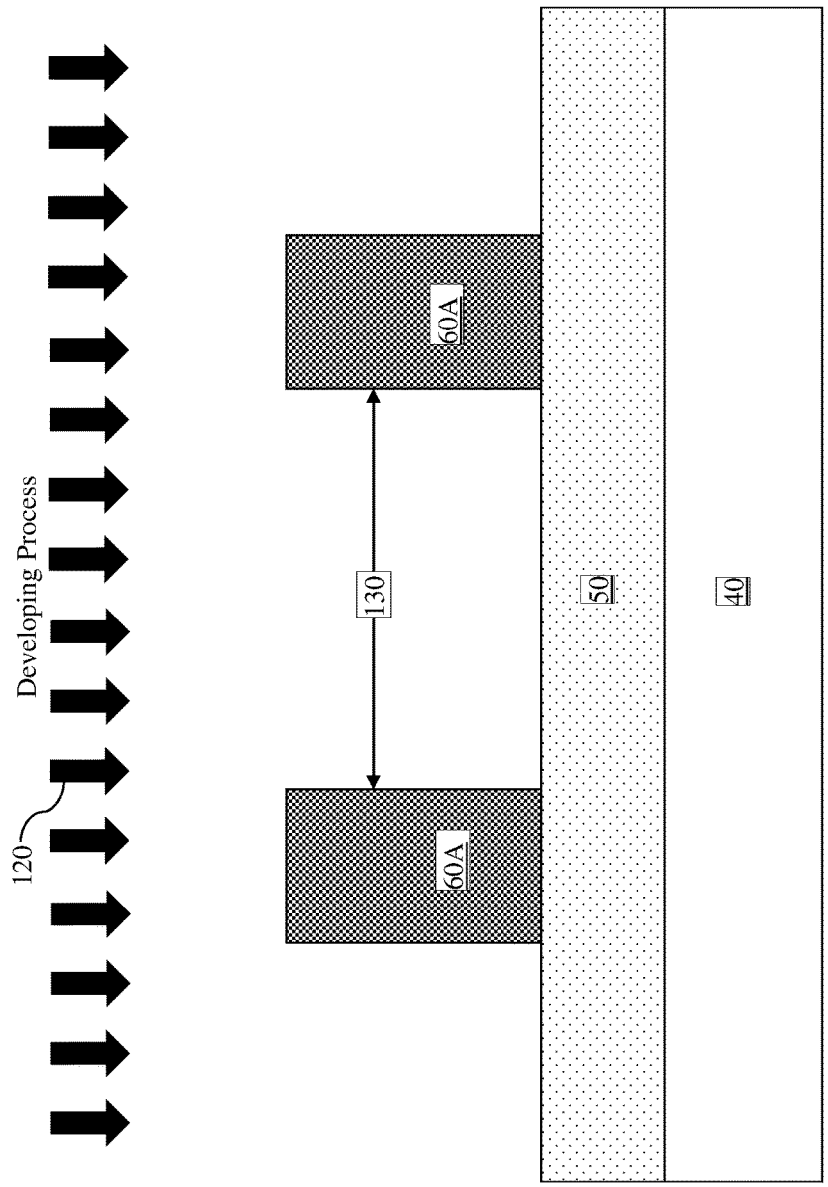

Referring now to FIG. 3A, a developing process 120 is performed to develop the photoresist layer 60. A developer solution is applied to the photoresist layer 60 as a part of the developing process 120. In some embodiments, the developer solution includes n-butyl acetate (n-BA). As is shown in FIG. 3A, the developer solution washes away the portions of the photoresist layer 60 that are not exposed to the UV light 80, but the portions 60A of the photoresist layer 60 exposed to the UV light 80 still remain. These portions 60A may be referred to as photoresist patterns 60A. A gap or distance 130 separates the adjacent photoresist patterns 60A. The dimension of the distance 130 defines the lateral dimension of subsequent features to be formed, such as contact hole.

Figure 3B:
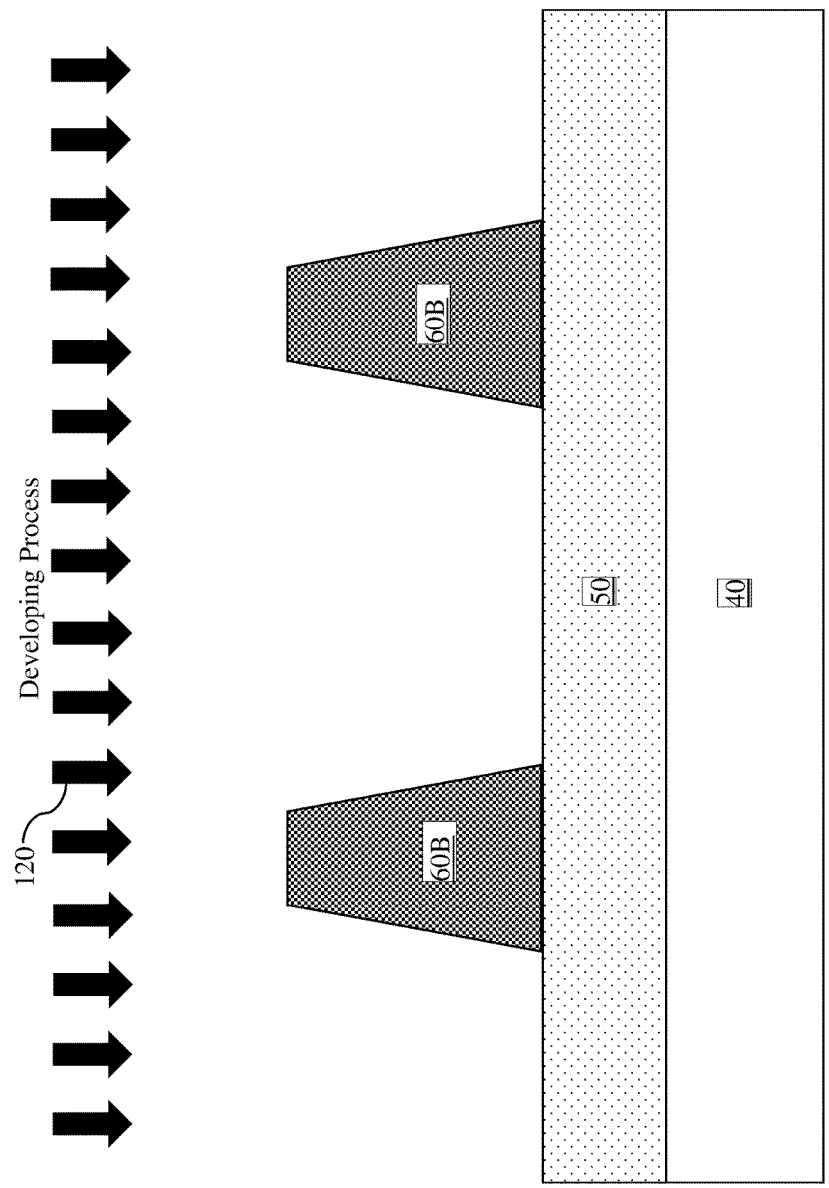
Figure 3C:
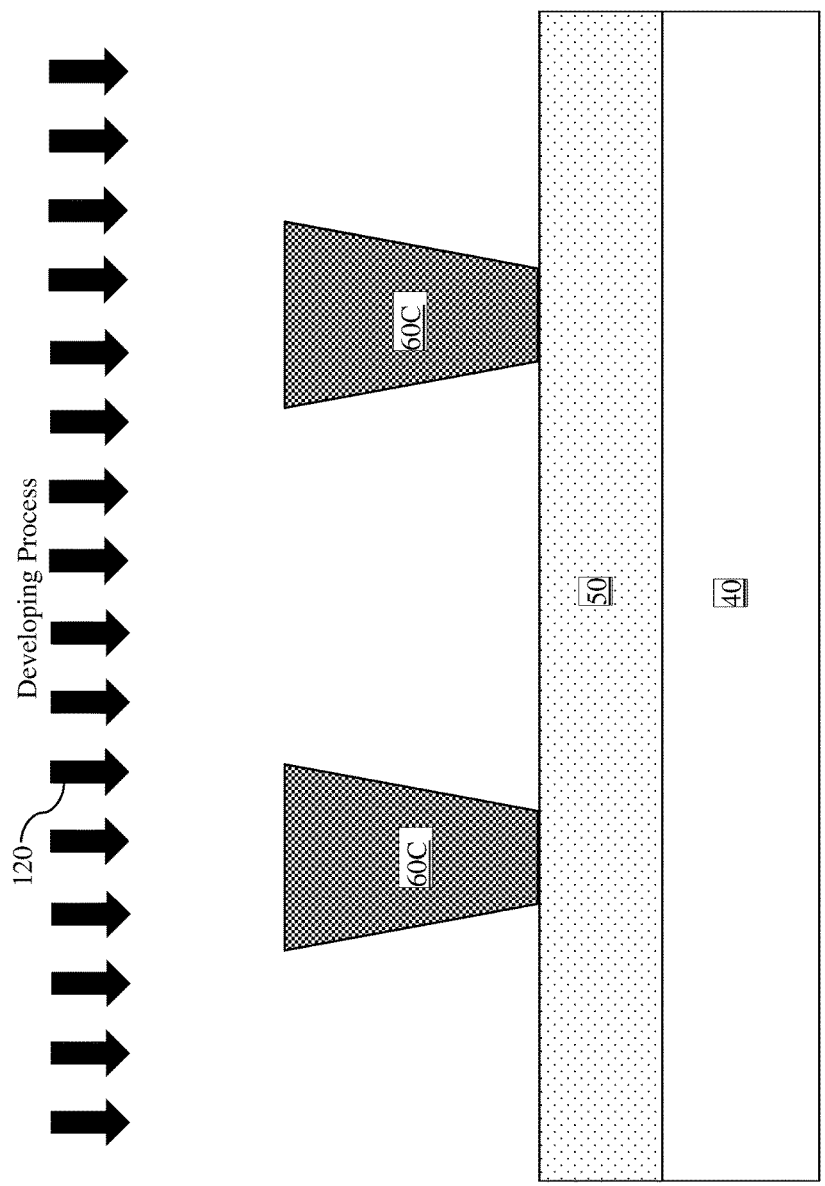

However, various imperfections of the lithography process (e.g., defocusing) may cause the photoresist patterns to have non-straight cross-sectional profiles. For example, referring to FIG. 3B, the photoresist patterns 60B may have a cross-sectional profile known as a "footing" profile, where the photoresist patterns 60B have narrower lateral dimensions at the top but wider lateral dimensions at the bottom. In other words, the photoresist patterns 60B in FIG. 3B are shaped similar to trapezoids. As another example, referring to FIG. 3C, the photoresist patterns 60C may have a cross-sectional profile known as a "T-top" profile, where the photoresist patterns 60C have wider lateral dimensions at the top but narrower lateral dimensions at the bottom. In other words, the photoresist patterns 60C in FIG. 3C are shaped similar to upside-down trapezoids.

The photoresist patterns 60B with the footing profile or the photoresist patterns 60C with the T-top profile cause the distances or the gaps between the adjacent photoresist patterns 60B/60C to vary, which adversely affects the subsequent patterning process. In addition, a shrink material will also be applied on the photoresist patterns 60B/60C to further enlarge the photoresist patterns (enlarged laterally) and to reduce the gaps/distances between them (e.g., as a way to achieve a smaller critical dimension). The footing and T-top profiles of the photoresist patterns 60B/60C in FIGS. 3B and 3C will also transfer to the enlarged photoresist patterns. Again, this negatively affects various aspects of the subsequent patterning process, such as the critical dimension uniformity.

Figure 4A:
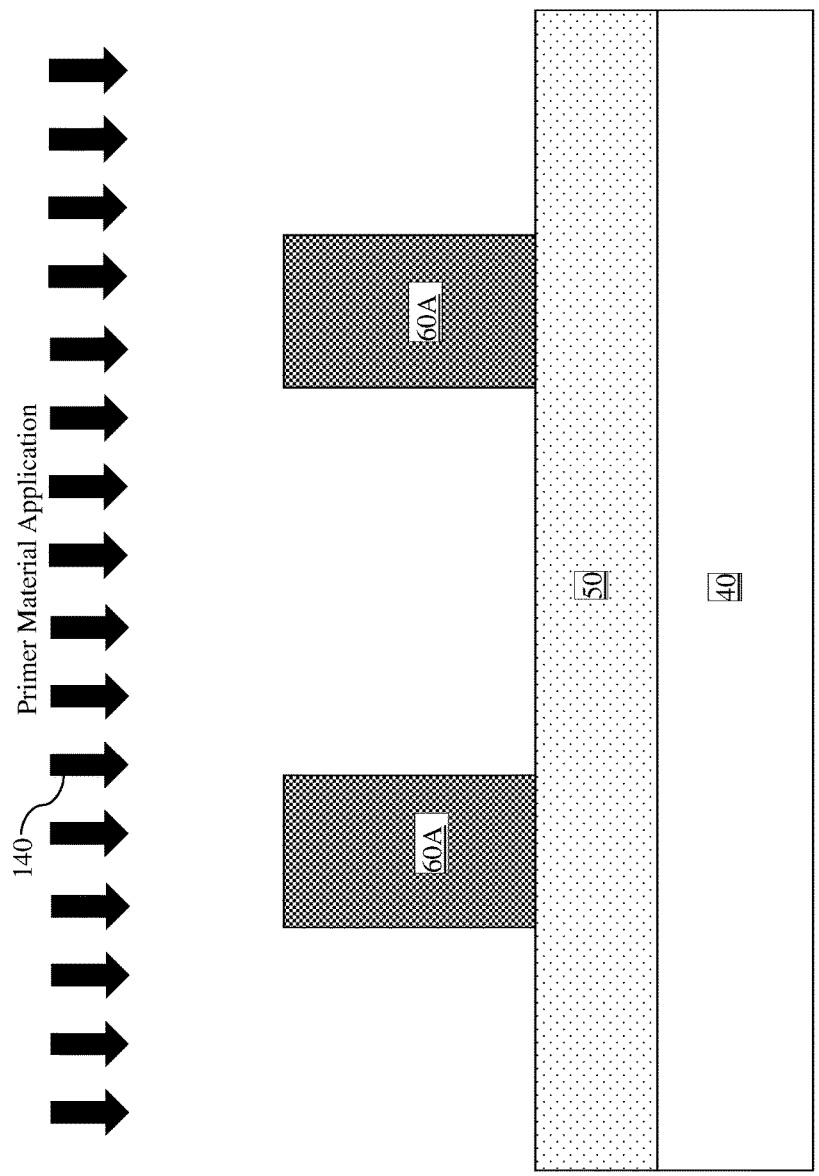
Figure 4B:
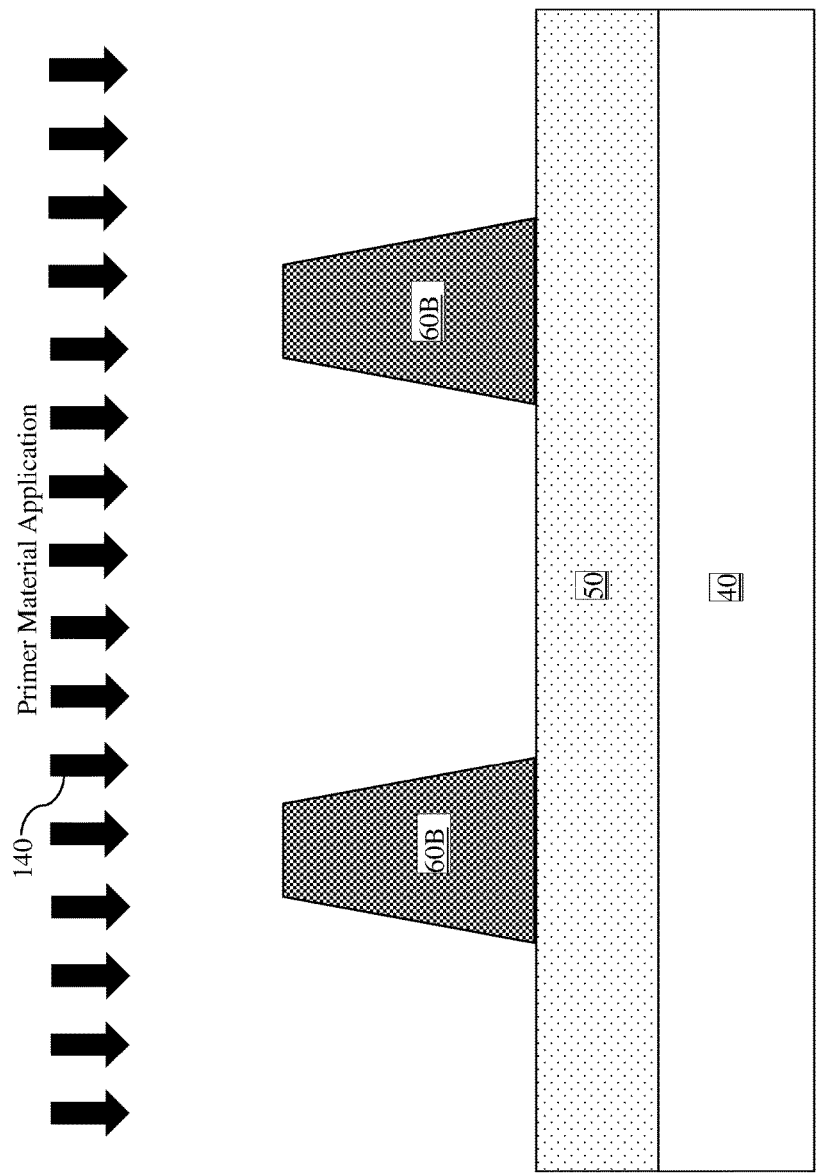
Figure 4C:
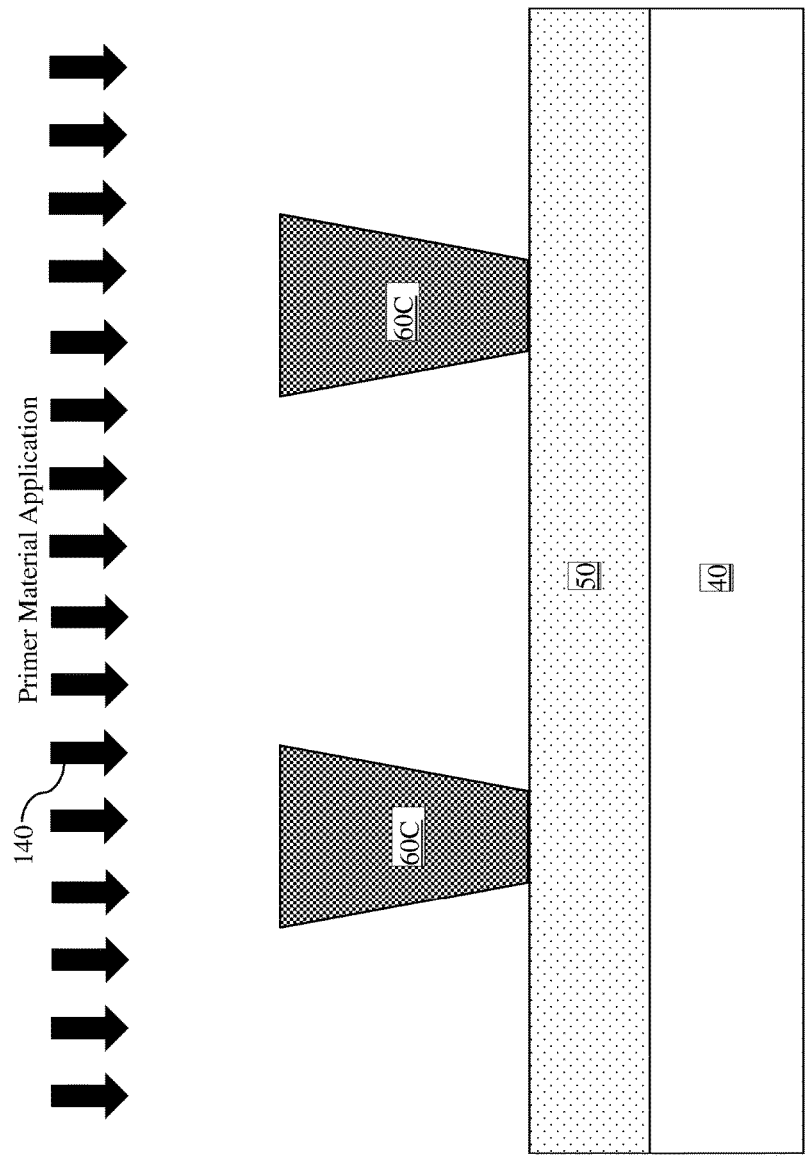

According to the various aspects of the present disclosure, a primer material will be applied on the photoresist patterns before the coating of the shrink material, so as to straighten the profiles of the photoresist patterns. Referring to FIGS. 4A, 4B, and 4C, a primer material application process 140 is performed to the photoresist patterns 60A/60B/60C. The primer material has a solvent that is more hydrophilic than an organic developer used in the developing process 120 (see FIGS. 3A-3C). The reason is that the more hydrophilic solvent can de-scum and smoothen the profile of the photoresist patterns. In some embodiments, the solvent of the primer material has a dipole moment that is higher than n-butyl acetate (NBA), which is commonly used as a developer in a developing process, such as the developing process 120. The NBA has a dipole moment (e.g., electric dipole moment) of about 1.9 D. Thus, the dipole moment of the solvent of the primer material is greater than about 1.9 D. In some embodiments, the solvent of the primer material contains alkyl alcohol:R1-OH, wherein R1 is C1~C7. In some other embodiments, the solvent of the primer material contains alkyl ester:R2COOR3, wherein R2 and R3 are C2~C6. In various embodiments, R1, R2, and R3 may each represent an alkyl group, which may be a long chain or a branch. In some embodiments, the solvent of the primer material can be a single solvent, a co-solvent, or water.

Figure 5A:
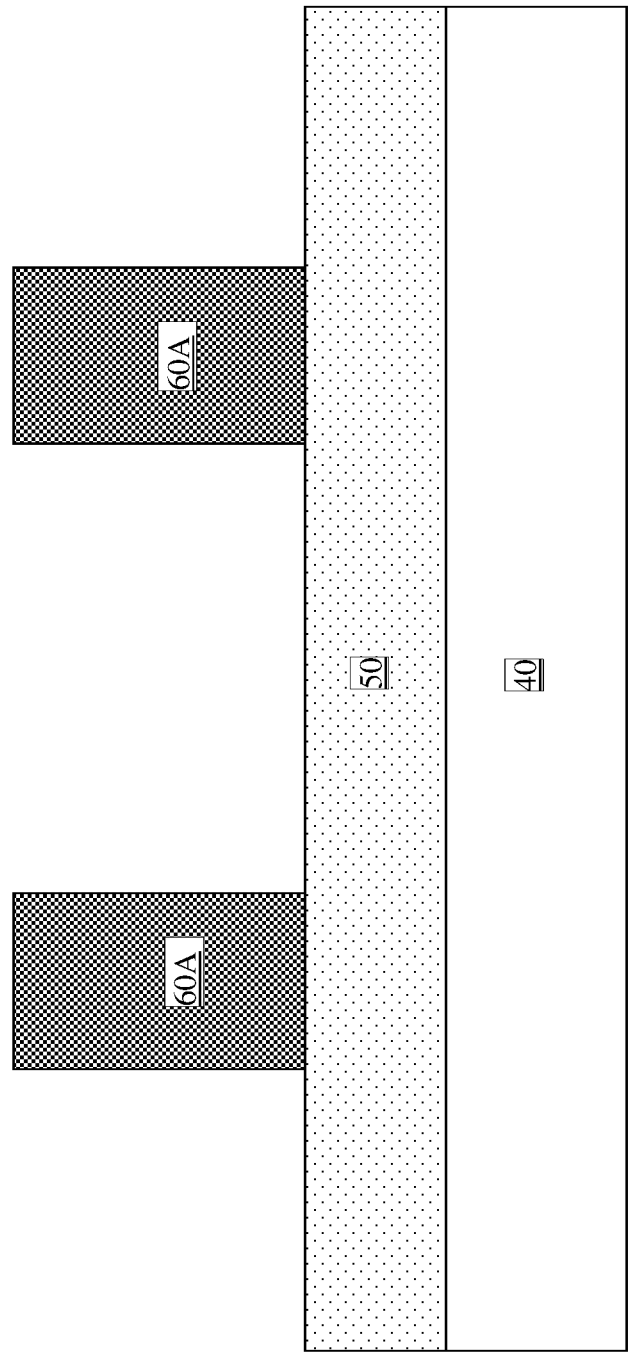
Figure 5B:
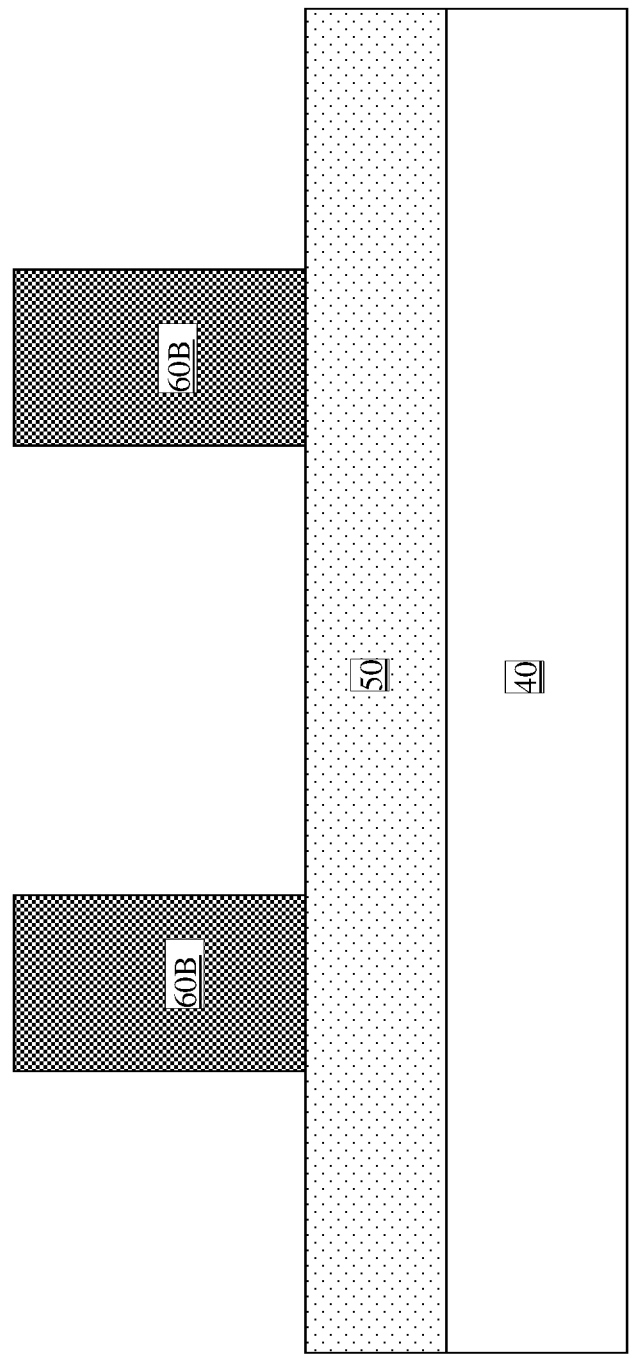
Figure 5C:
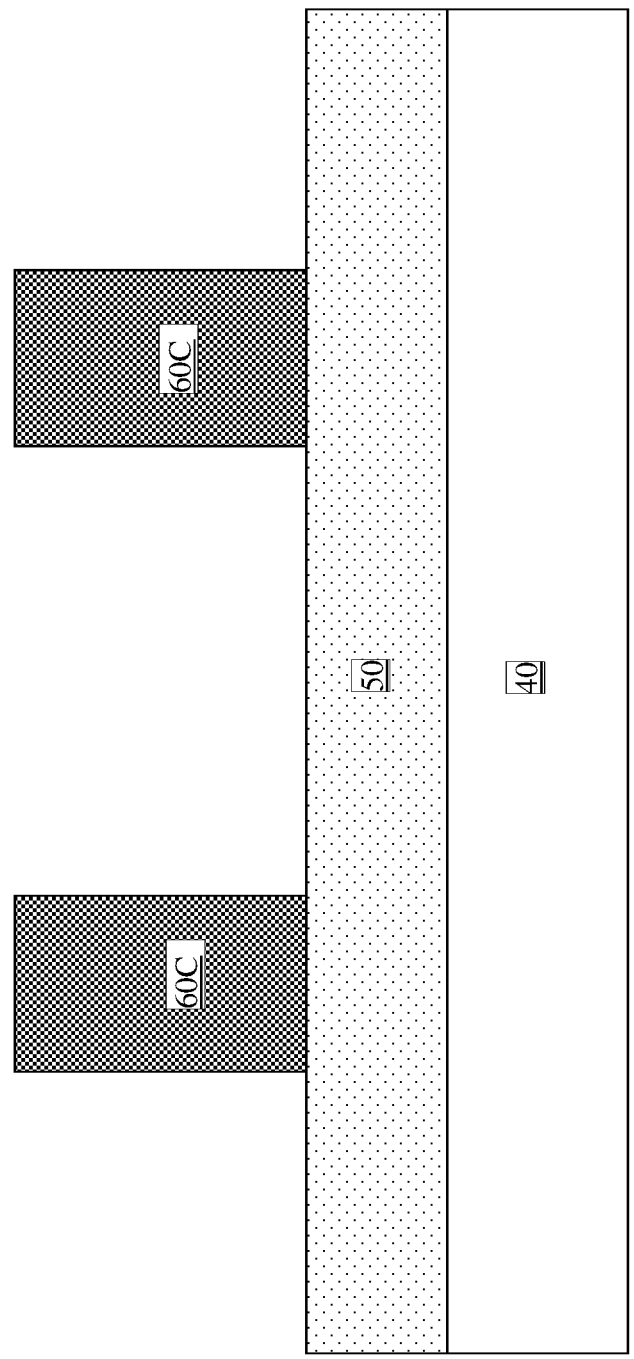

In any case, the greater dipole moment allows the primer material herein to de-scum and smooth out the profile of the photoresist patterns, thereby straightening the profiles of the photoresist patterns. This is illustrated in FIGS. 5A, 5B, and 5C, where the photoresist patterns 60A, 60B, and 60C each have a more straightened cross-sectional profile compared to before the primer material application process 140 was performed. Thus, in spite of lithography imperfections such as defocusing, critical dimension uniformity may still be achieved.

Figure 6:
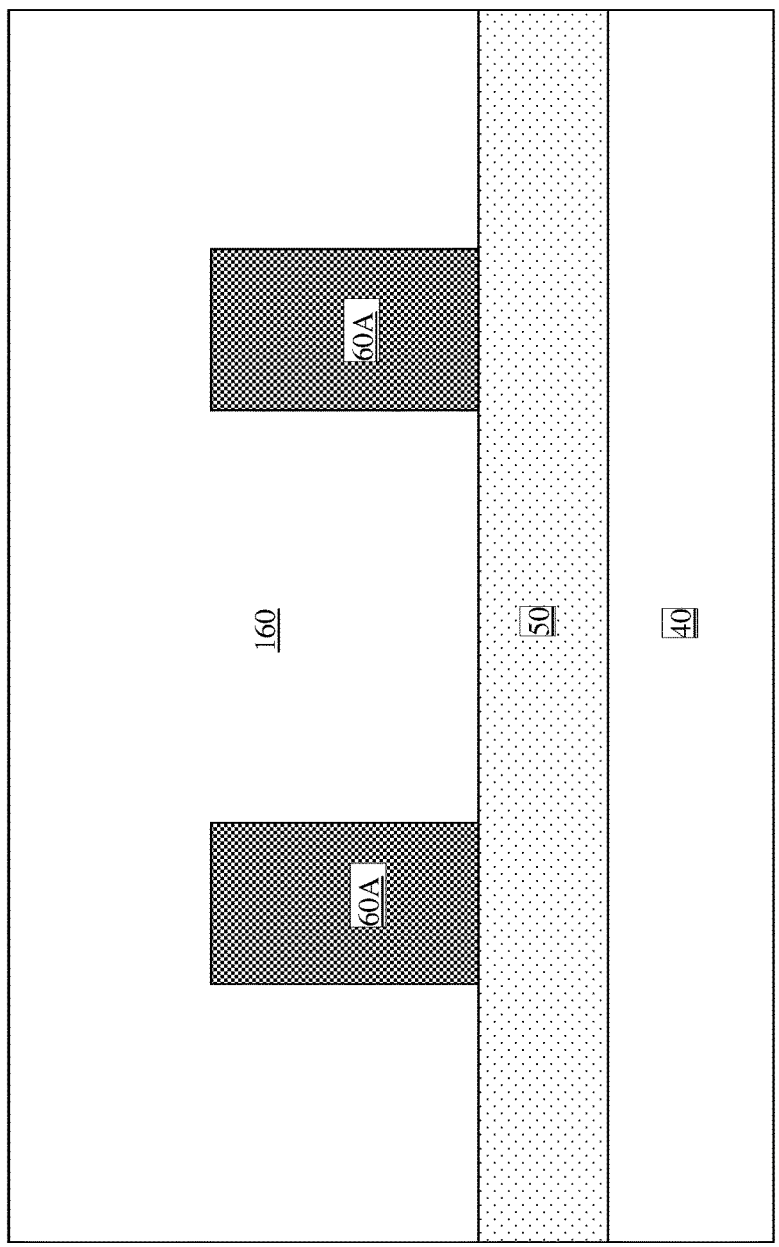

As discussed above, a shrink material needs to be coated on the photoresist patterns to enlarge their lateral dimensions and to reduce the gaps between the photoresist patterns. FIGS. 6-8 illustrate a process in which a shrink material is used to enlarge the photoresist patterns. In FIG. 6, a shrink material 160 is coated on the photoresist patterns 60A (or 60B/60C) and over the material layer 50. In some embodiments, the shrink material 160 includes a "resolution enhancement lithography assisted by chemical shrinkage" material (or RELACS). The RELACS material includes a water-soluble material (e.g., a polymer) having thermal cross-linking properties. As such, a portion of the RELACS material coated on a photoresist film can become cross-linked to the photoresist film during a baking process, thereby reducing gaps between adjacent photoresist films. The rest of the unreacted (e.g., un-cross-linked) RELACS material can be removed in a developing process following the baking. As examples, the details of the RELACS material are discussed in an article entitled "Resists Join the Sub-Lambda Revolution," by Laura J. Peters, published in Semiconductor International, in September, 1999, as well as in Japanese Patent Application KOKAI publication No. H10-73927, the contents of each of which are hereby incorporated by reference in their respective entireties.

Figure 7A:
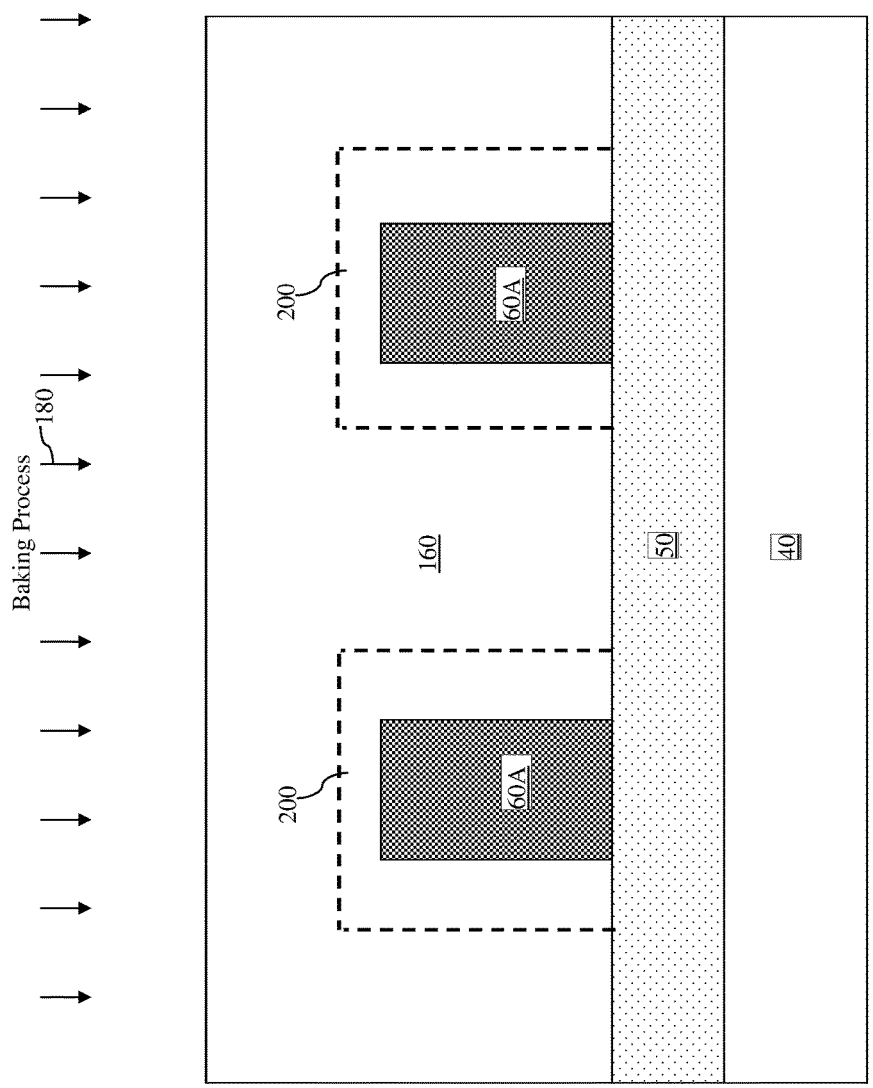
Figure 8:
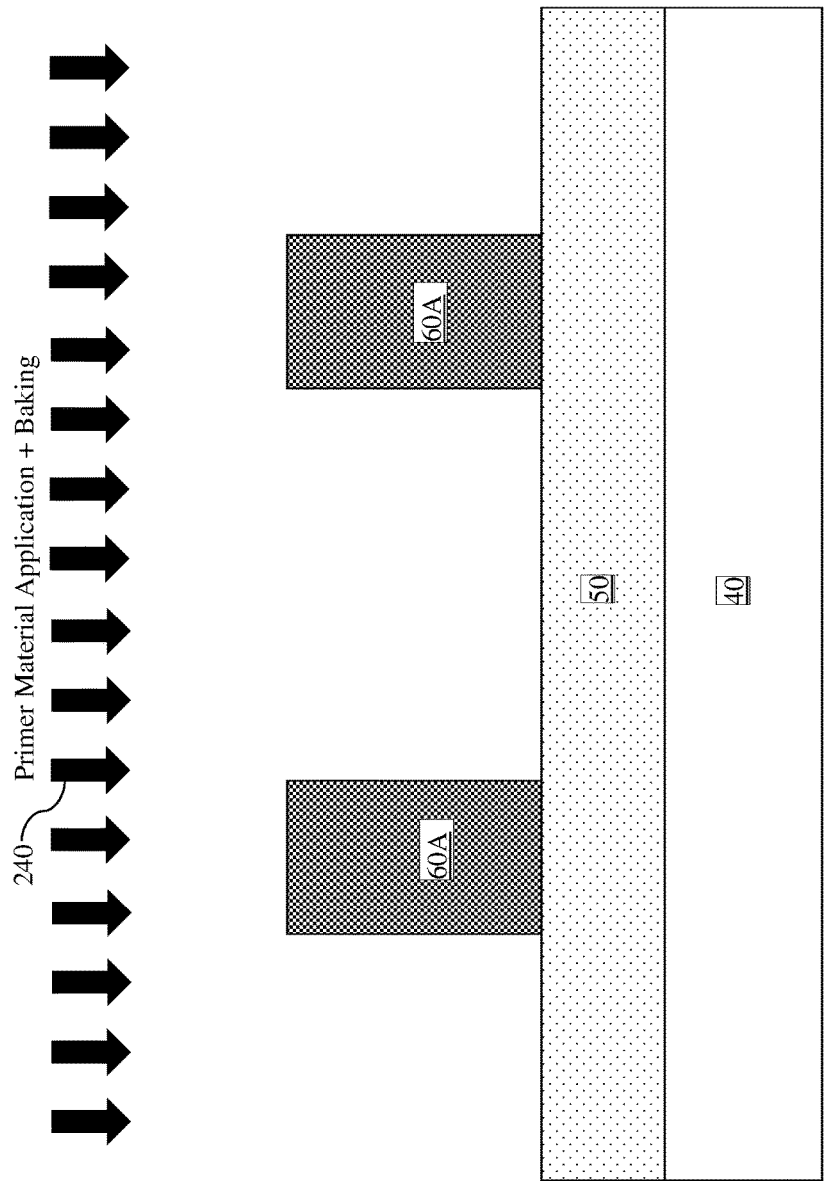

FIG. 7A illustrates an example where the RELACS material is used as the shrink material. In FIG. 7A, a baking process 180 (or heating process) 180 is performed to the shrink material 160 and the photoresist patterns 60A. In some embodiments, the baking process is performed at a process temperature in a range between about 140 degrees Celsius and 170 degrees Celsius and for a process duration in a range between about 60 seconds to about 120 seconds. The baking process 180 forms cross-linking films 200 and 201 around the photoresist patterns 60A. In response to the thermal energy in the baking process 180, portion of the shrink material 160 (RELACS material herein) coated around the photoresist patterns 60A undergo a chemical reaction, thereby causing these portions of the shrink material 160 to become cross-linked. As a result, cross-linking films 200 are formed on the upper and sidewall surfaces of the photoresist patterns 60A. Due to the cross-linking nature, the cross-linking films 200 adhere to the upper and sidewall surfaces of the photoresist patterns 60A, which prevents the cross-linking films 200 from being removed in a subsequent developing process. In other words, the cross-linking films 200 may be viewed as a part of the enlarged photoresist patterns 60A when the photoresist patterns 60A are used as masks in subsequent processes.

In some other embodiments, the shrink material 160 includes a "shrink assist film for enhanced resolution" material (or SAFIER) developed by Tokyo Ohka Kogyo Co. The SAFIER material includes an aqueous solution that contains thermo-responsive polymers that facilitate photoresist flow during a baking process. The SAFIER material may or may not react with the photoresist chemically but provides mechanical support to the sidewalls of the photoresist as it flows. The mechanical support provided by the SAFIER material minimizes photoresist pattern profile degradation. The SAFIER material can be removed in a developing process following the baking. As an example, the details of the SAFIER material are discussed in a paper entitled "Electron-beam SAFIER™ process and its application for magnetic thin-film heads," by XiaoMin Yang, et al., published in the Journal of Vacuum Science & Technology B, Volume 22, Issue 6, in December 2004, the contents of which are hereby incorporated by reference in its entirety.

Figure 7B:
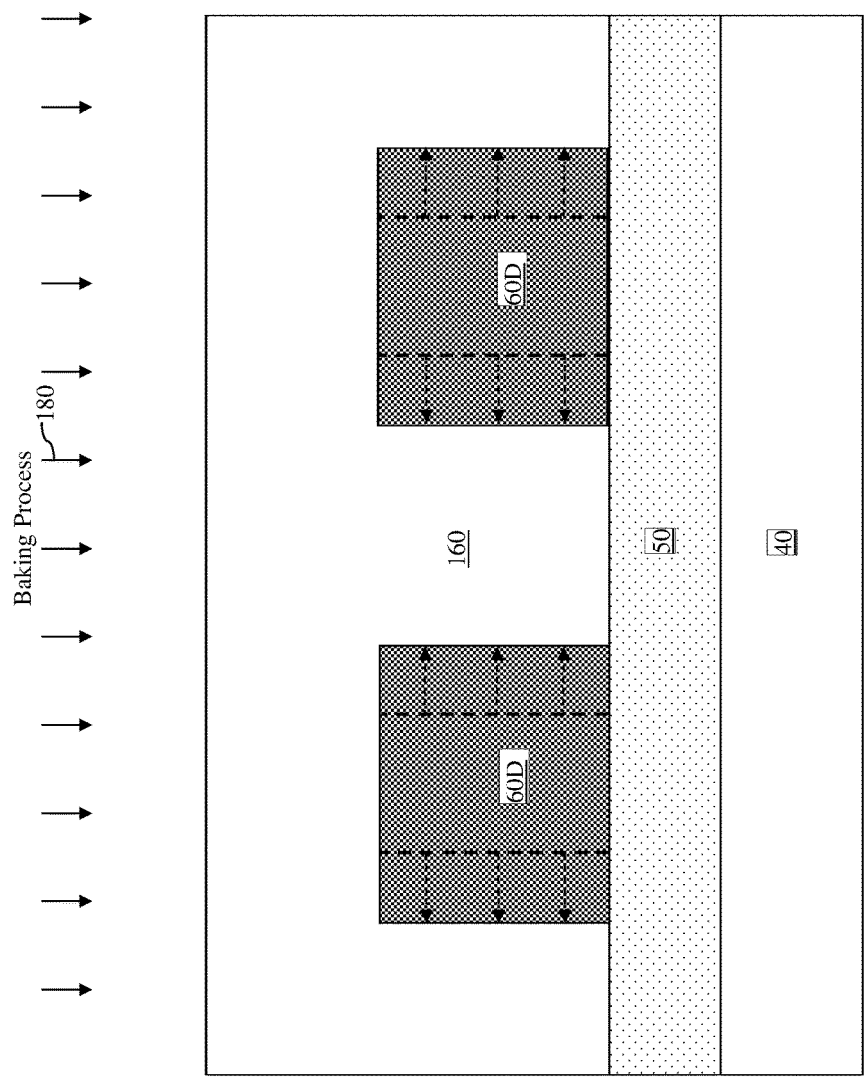

FIG. 7B illustrates an example where the SAFIER material is used as the shrink material. Referring now to FIG. 7B, a baking process (or heating process) 180 is performed to the shrinkage material 60 and the photoresist patterns 60A. In some embodiments, the baking process is performed at a process temperature in a range between about 100 degrees Celsius and 160 degrees Celsius and for a process duration in a range between about 60 seconds to about 90 seconds. The SAFIER material contains thermo-responsive polymers that facilitate a photoresist flow during the baking process 180. In other words, the photoresist patterns 60A flow outward laterally and are reshaped as photoresist patterns 60D. The sidewalls of the photoresist patterns before the flow occurs are illustrated herein as the broken lines, and the directions of the flow are illustrated using the arrows that point laterally in FIG. 7B. The sidewalls of the photoresist patterns consequently move closer toward each other, thereby reducing the distance in between the photoresist patterns. The height of the photoresist patterns 60D may also be reduced somewhat due to the lateral expansion. The shrinkage material 60 (i.e., the SAFIER material) also provides some mechanical support to the sidewalls of the photoresist patterns 60D during the photoresist flow, thereby allowing the sidewalls to maintain their shapes.

The reaction between the shrink material 160 and the photoresist material is attributed to an acid labile group (ALG) unit of the photoresist. In more detail, photoresist undergoes chemical amplification resist reaction (CAR) to produce polar switch and patterning. A polymer in the photoresist contains an acid labile group (ALG) unit. The exposure and baking processes produces acid that reacts with the ALG unit to deprotect the ALG unit. The deprotected ALG unit may also be referred to as a cleaved ALG unit. The deprotected or cleaved ALG unit is the portion of the photoresist material that actually reacts with the shrink material. However, some photoresist materials may not have sufficient amounts of deprotected ALG units, which in turn leads to inadequate reaction between the photoresist and the shrink material. This causes an insufficient amount of photoresist enlargement.

To overcome this problem, the present disclosure applies a primer material to the photoresist before the shrink material coating. The primer material increases the amount of deprotected ALG units, which enhances the reaction with the shrink material, thereby achieving a more desired enlargement of the photoresist. For example, referring to FIG. 8, a primer material application+baking process 240 is performed to the photoresist patterns 60A. The primer material used in the primer material application process 240 is acidic and has a PH value less than 7. In various embodiments, the primer material may be sulfonic acid, sulfuric acid, hydrochloric acid, acetic acid, or combinations thereof. After the application of the primer material, the photoresist patterns 60A undergo baking to facilitate a secondary chemical amplification reaction (CAR). The primer material induces the secondary chemical amplification reaction, which causes more ALG units to become deprotected (or cleaved). These additional deprotected ALG units enhance the photoresist material's reaction with the shrink material, which helps enlarge the photoresist patterns 60A.

Figure 9:
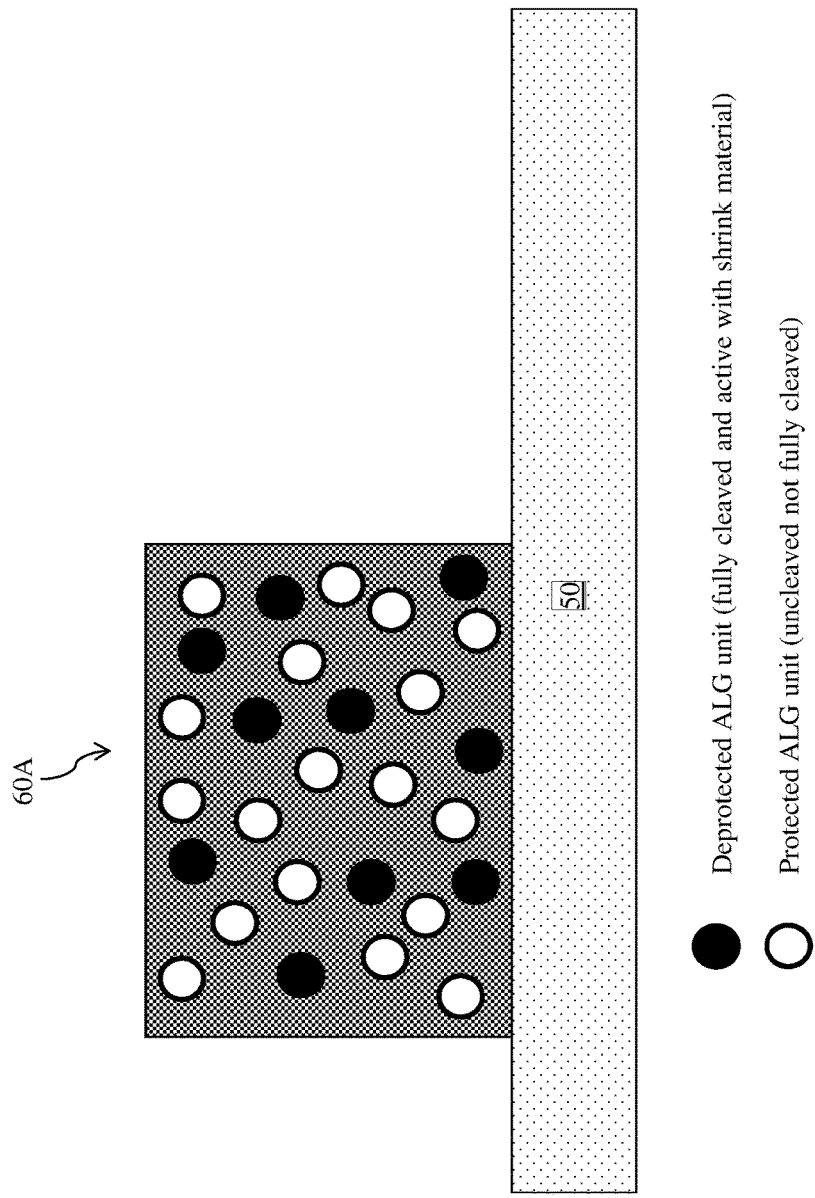
Figure 10:
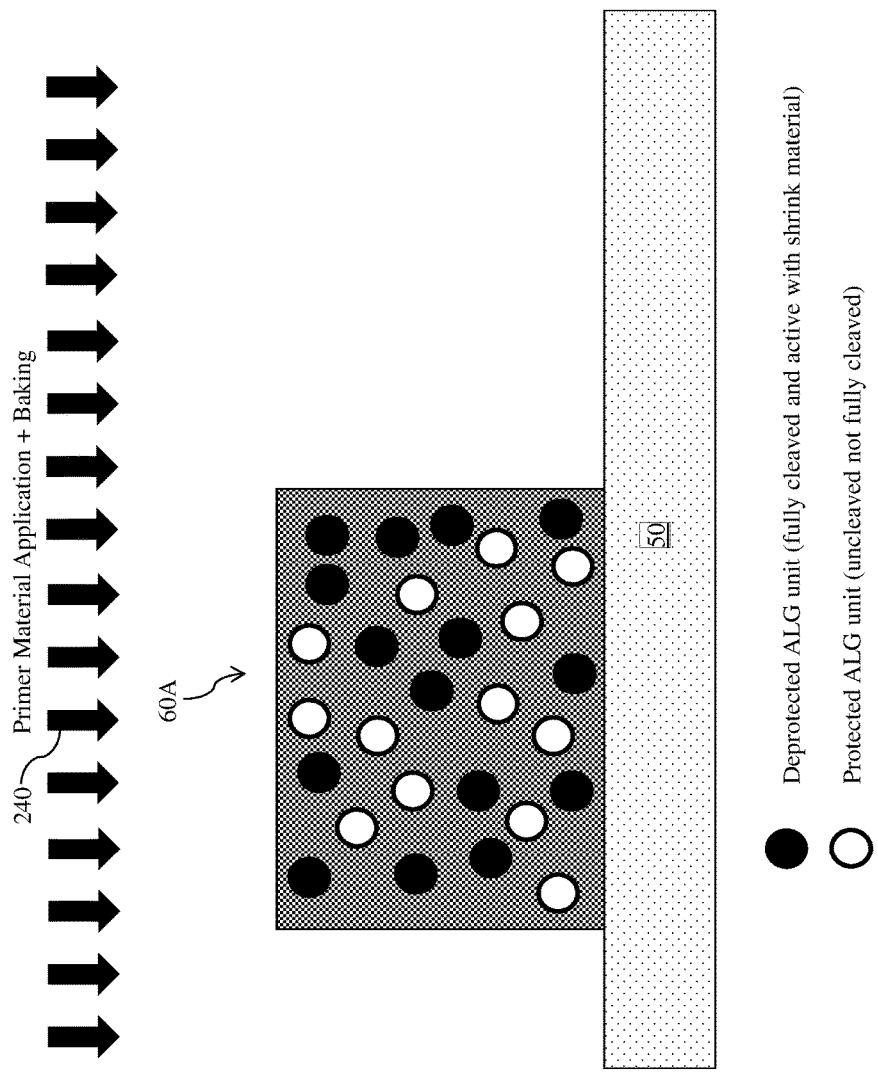
Figure 11:
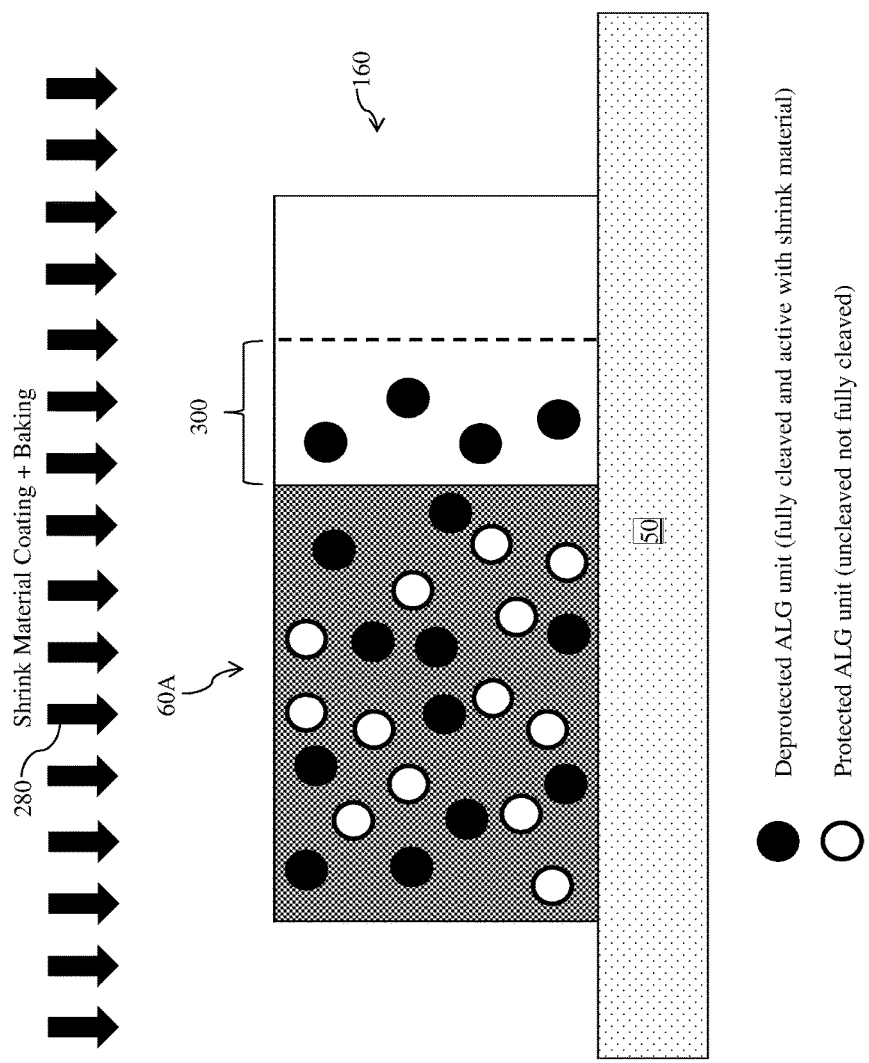

FIGS. 9-11 provide a simple visual illustration of how the primer material helps increase the amount of deprotected ALG units in the photoresist to enhance the reaction with the shrink material. Referring to FIG. 9, a "zoomed-in" cross-sectional view of a portion of the photoresist pattern 60A is illustrated. In FIG. 9, the primer material has not been applied on the photoresist pattern 60A yet. The photoresist pattern 60A contains a plurality of ALG units, some of which are protected (meaning that they are uncleaved or not fully cleaved), and others of which are deprotected (meaning that they are fully cleaved). The protected ALG units are represented by white dots, while the deprotected ALG units are represented by black dots in FIG. 9. The deprotected ALG units react with the shrink material, but the protected ALG units do not react with the shrink material. At this stage, suppose that X % of all ALG units are deprotected. In some embodiments, X is in a range from about 10% to about 50%.

Referring now to FIG. 10, the primer material application+baking process 240 is performed. The application of the primer material followed by the baking process induces a secondary chemical amplification reaction, which causes at least some of the protected ALG units to become deprotected (cleaved). In some embodiments, this may be caused at least part by lowering the activation energy of the ALG units, which makes it easier for them to become deprotected. The concentration of the deprotected ALG units increases to Y % after the performance of the primer application+baking process 240, where Y>X. In some embodiments, Y is in a range from about 40% to about 80%.

Referring now to FIG. 11, the shrink material 160 is coated via a shrink material coating+baking process 280. The greater amount of deprotected ALG units help increase an intermixing area 300, which is the part of the shrink material that will adhere to the photoresist pattern 60A and will not be removed later. Had the primer material discussed above in FIG. 8 or FIG. 10 not been applied, the intermixing area 300 would have been smaller, which means the photoresist enlargement wouldn't have been as much as desired. Thus, the present disclosure improves the photoresist enlargement (and correspondingly, the critical dimension reduction) by the application of the primer material followed by baking.

In some other embodiments, the primer material can also contain a polymer that will interact with the photoresist material and produce a resist surface that is more hydrophilic. The polymer is based on a methylacrylate platform and may include a carboxyl group, an amide group, or an amino group. In some embodiments, the molecular weight of the polymer is higher than 1000. In addition, the primer may contain just one type of polymer in some embodiments, or it may contain a mixture of different polymers in other embodiments. The carboxyl group, amide group, or the amino group of the polymer can bond with the deprotected ALG unit of the photoresist material. At the same time, the polymer contains more ALG units that can interact with the shrink material. In other words, for every deprotected ALG unit that the polymer bonds with, it creates multiple other ALG units that are free to interact with the shrink material, and this enhances the reaction with the shrink material, thereby increasing the photoresist volume.

Figure 12:
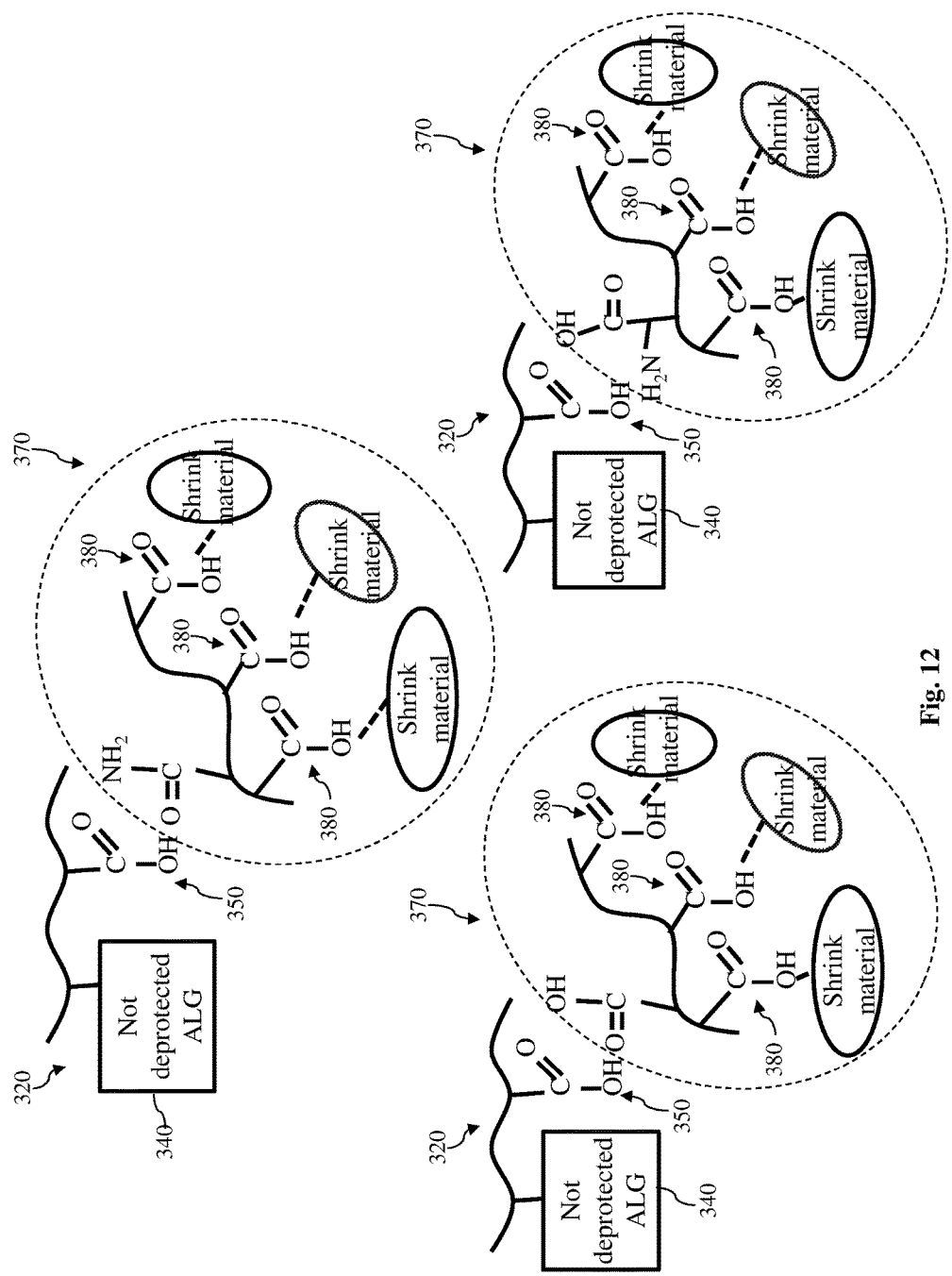
FIG. 12 illustrates the chemical formulas of polymers of a primer material in accordance with some embodiments of the present disclosure.

FIG. 12 illustrates example chemical formulas of the polymers and their bonding with the deprotected ALG units of the photoresist. FIG. 12 illustrates a chemical formula of a portion of the photoresist as photoresist 320. The units that are not ALG units or uncleaved or partially cleaved ALG units (i.e., not deprotected ALG units) are represented by the box 330. The deprotected ALG units 350 are illustrated as COOH. Meanwhile, the polymers are labeled as 370 and are encircled by the dotted circles.

FIG. 12 illustrates the three example embodiments of the polymer where the polymer 370 includes the carboxyl group, or the amide group, or the amino group. In each embodiment, the polymer is bonded with the deprotected ALG unit 350, for example via $CONH_2$ (i.e., amide group) or via $H_2NCOOH$ (i.e., amino group), or COOH (i.e., carboxyl group). At the same time, each polymer 370 contains multiple (e.g., 3 herein) deprotected ALG units 380 (represented by COOH). Each of these deprotected ALG units 380 of the polymer 370 can individually react with the shrink material. Thus, for every ALG unit bonded to the polymer, multiple other deprotected ALG units are created to interact with the shrink material. Stated differently, each deprotected ALG unit is "swapped out" by multiple other deprotected ALG units by the polymer bonding. In the embodiment illustrated herein, this effectively multiplies the deprotected ALG units by a ratio of 3:1. As discussed above, the greater number of deprotected ALG units that can now react with the shrink material allows for better intermixing with the shrink material and allows the photoresist to be enlarged more, which reduces the gap between adjacent photoresist patterns, thereby achieving smaller critical dimensions.

Figure 13:
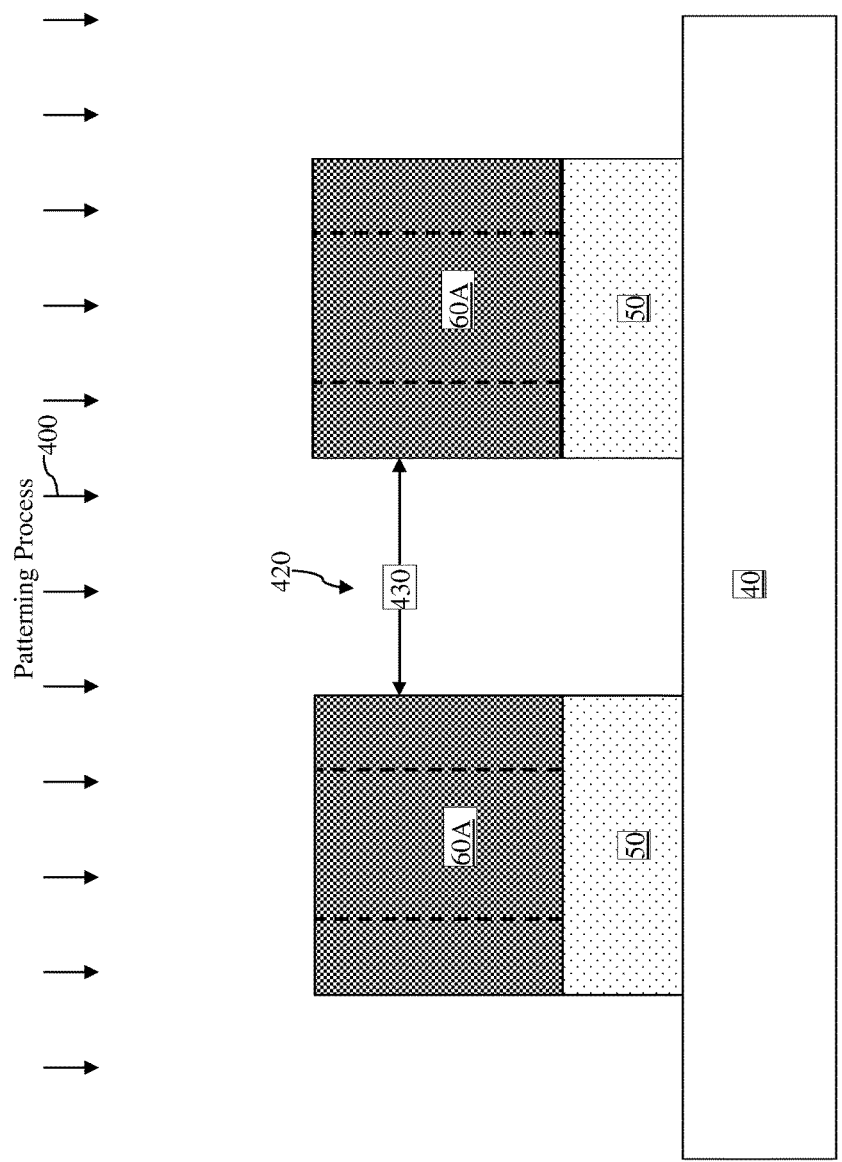

Referring now to FIG. 13, the shrink material is baked to facilitate the reaction with the photoresist patterns 60A, and therefore the photoresist patterns 60A are enlarged. As discussed above, the primer material discussed herein allows for a greater amount of photoresist expansion (laterally) by effectively producing more deprotected ALG units. The unreacted portions of the shrink material are then removed by an organic solvent developing process. Thereafter, a patterning process 400 is performed to pattern the material layer 50 below the photoresist patterns 60A. The photoresist patterns 60A are used as a mask during the patterning process 400. The portions of the material layer 50 that are exposed (or not protected by the photoresist patterns 60A) are etched away, for example. This forms an opening or trench 420, which may be later used to form conductive contacts or other suitable microelectronic components of an IC. Again, a smaller critical dimension—the lateral dimension 430 of the opening 420—can be achieved using the methods and materials discussed above. The photoresist patterns 60A may be removed later by a photoresist removal process, such as a stripping or an ashing process.

Figure 14:
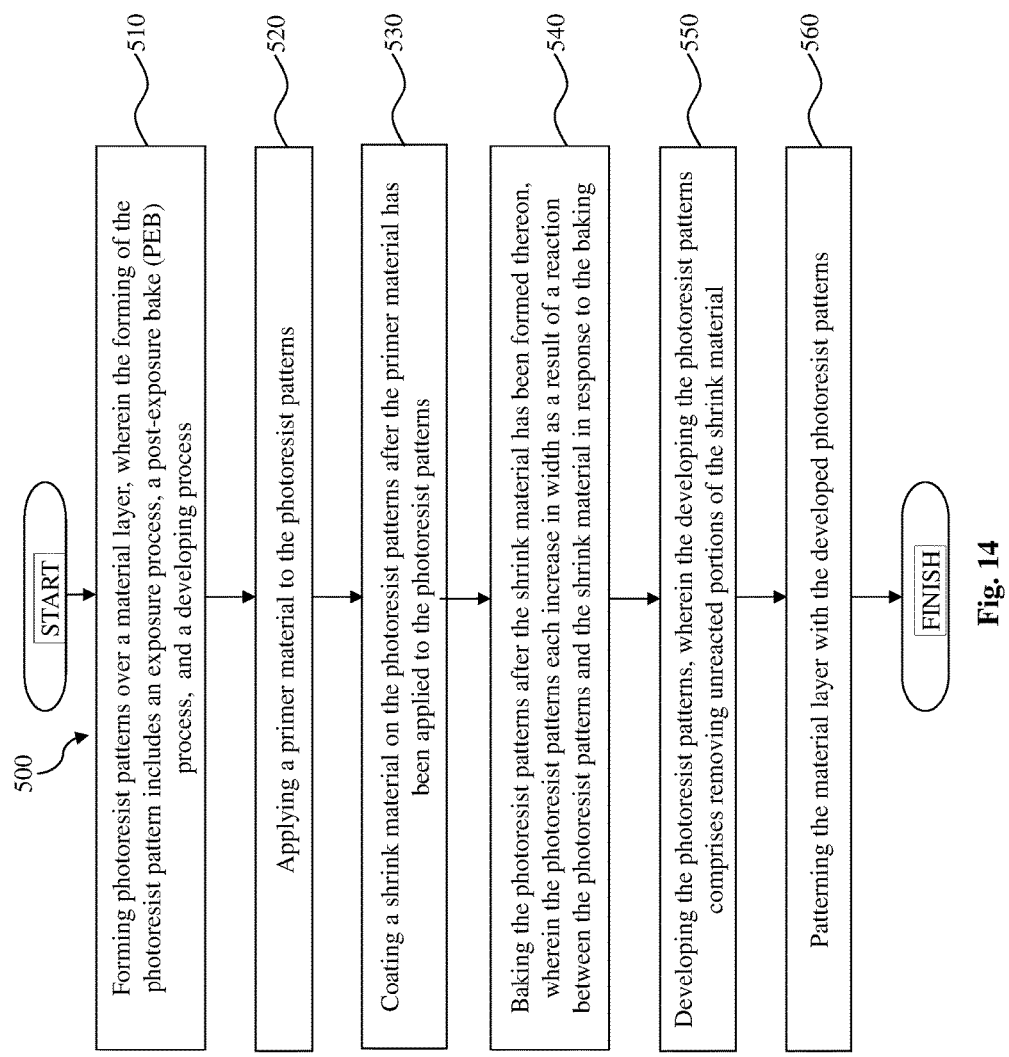
FIG. 14 is a flowchart illustrating a method of fabricating a semiconductor device in accordance with some embodiments of the present disclosure.

FIG. 14 is a flowchart of a method 500 of fabricating a semiconductor device according to various aspects of the present disclosure. The method 500 may be performed as a part of a lithography process. The method 500 includes a step 510 of forming photoresist patterns over a material layer. The forming of the photoresist patterns includes an exposure process, a post-exposure bake (PEB) process, and a developing process. In some embodiments, the forming the photoresist patterns is performed using a negative-tone photoresist material.

The method 500 includes a step 520 of applying a primer material to the photoresist patterns. In some embodiments, the primer material is configured to straighten a profile of the photoresist patterns. In some embodiments, the applying of the primer material comprises applying a solvent having a dipole moment that is higher than a dipole moment of n-butyl acetate. In some embodiments, the applying the solvent contains applying alkyl alcohol:R1-OH, wherein R1 is C1~C7. In some embodiments, the applying the solvent contains applying alkyl ester:R2COOR3, wherein R2 and R3 are C2~C6.

In some embodiments, the primer material is configured to increase a number of deprotected acid labile group (ALG) units of the photoresist pattern. In some embodiments, the applying of the primer material comprises applying an acid. In some embodiments, the applying the acid comprises applying a sulfonic acid, a sulfuric acid, a hydrochloric acid, or an acetic acid.

In some embodiments, the applying of the primer material comprises applying a polymer that is configured to bond with an acid labile group (ALG) unit of the photoresist pattern. In some embodiments, the applying of the primer material comprises applying a material having a methylacrylate platform. In some embodiments, the material having a methylacrylate platform includes a polymer that contains a carboxyl group, an amide group, or an amino group.

The method 500 includes a step 530 of coating a shrink material on the photoresist patterns after the primer material has been applied to the photoresist patterns.

The method 500 includes a step 540 of baking the photoresist patterns after the shrink material has been formed thereon. The photoresist patterns each increase in width as a result of a reaction between the photoresist patterns and the shrink material in response to the baking.

The method 500 includes a step 550 of developing the photoresist patterns. The developing the photoresist patterns comprises removing unreacted portions of the shrink material.

The method 500 includes a step 560 of patterning the material layer with the developed photoresist patterns.

It is understood that additional processes may be performed before, during, or after the steps 510-560 of the method 500 to complete the fabrication of the semiconductor device. For example, the method 500 may include a step of baking the primer material and the photoresist pattern before the shrink material is coated. For reasons of simplicity, other additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the primer material can straighten the profiles of the photoresist patterns. This reduces the footing profile or the T-top profile of photoresist patterns that may be caused by various imperfections of lithography (e.g., defocusing). As a result, critical dimension uniformity is improved. Another advantage is that the primer material allows more ALG units to become deprotected. The greater amount of deprotected ALG units enhances the photoresist reaction with the shrink material, which leads to an enlarged photoresist (i.e., smaller gaps between photoresist patterns). Yet another advantage is that the primer material contains polymers that can bond with the ALG units but effectively "multiply" the number of deprotected ALG units, because each polymer bonded with one ALG unit has multiple other ALG units that are now free to interact with the shrink material. In other words, for each ALG unit bonded to the polymer, the polymer effectively creates more (for example 2 more) deprotected ALG units. The increased number of ALG units allows for better reaction with the shrink material, thereby improving the photoresist enlargement.

One embodiment of the present disclosure pertains to a method of fabricating a semiconductor device. A photoresist pattern is formed over a material layer. The forming of the photoresist pattern includes an exposure process, a post-exposure bake (PEB) process, and a developing process. A primer material is applied to the photoresist pattern. A shrink material is coated on the photoresist pattern after the primer material has been applied to the photoresist pattern.

Another embodiment of the present disclosure pertains to a method of fabricating a semiconductor device. A photoresist layer is formed over a patternable layer. The photoresist layer containing a negative tone photoresist material. An exposure process is performed to the photoresist layer. A post-exposure bake (PEB) process is performed to the photoresist layer. The photoresist layer is rinsed to develop a photoresist pattern. A primer material is applied to the photoresist pattern. The primer material is configured to: straighten a profile of the photoresist pattern, or to increase a number of deprotected acid labile group (ALG) units of the photoresist material, or to bond with the deprotected ALG units of the photoresist material. After the primer material is applied, the photoresist pattern is enlarged by coating a shrink material over the photoresist pattern, baking the shrink material, and removing portions of the shrink material. The patternable layer is patterned using the enlarged photoresist pattern as a mask.

Yet another embodiment of the present disclosure pertains to a method of fabricating a semiconductor device. A photoresist layer is formed over a material layer. The photoresist layer containing a negative tone photoresist material. An exposure process is performed to the photoresist layer. A post-exposure bake (PEB) process is performed to the photoresist layer. The photoresist layer is rinsed to develop a plurality of photoresist patterns separated by a plurality of gaps. A primer material is applied to the photoresist patterns. The primer material contains: a solvent having a dipole moment that is greater than a dipole moment of n-butyl acetate; a sulfonic acid, a sulfuric acid, a hydrochloric acid, or an acetic acid; or a polymer based on a methylacrylate platform. After the applying of the primer material, the gaps are reduced between the photoresist patterns by coating a shrink material over and between the photoresist patterns, baking the shrink material, and removing portions of the shrink material. An etching process is performed to etch away portions of the material layer that are exposed by the reduced gaps.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a photoresist pattern over a material layer, wherein the forming of the photoresist pattern includes an exposure process, a post-exposure bake (PEB) process, and a developing process in which an organic developer is used, and wherein the photoresist pattern has a footing profile or a T-top profile;
    after the developing process is performed, applying a primer material to the photoresist pattern, wherein the primer material includes a solvent that is more hydrophilic than the organic developer and has a dipole moment greater than a dipole moment of the organic developer, wherein an application of the primer material reduces the footing profile or the T-top profile; and
    coating a shrink material on the photoresist pattern after the primer material has been applied to the photoresist pattern.

2. The method of claim 1, wherein the forming of the photoresist pattern comprise forming a plurality of photoresist patterns, and wherein the applying and the coating are performed to the plurality of photoresist patterns;
    wherein the method further comprises:
    baking the photoresist patterns after the shrink material has been formed thereon, wherein the photoresist patterns each increase in width as a result of a reaction between the photoresist patterns and the shrink material in response to the baking;
    thereafter developing the photoresist patterns, wherein the developing the photoresist patterns comprises removing unreacted portions of the shrink material; and
    thereafter patterning the material layer with the developed photoresist patterns.

3. The method of claim 1, wherein the primer material is configured to straighten the footing profile or the T-top profile of the photoresist pattern before the shrink material is coated.

4. The method of claim 1, wherein the organic developer includes n-butyl acetate, and wherein the dipole moment of the solvent is higher than a dipole moment of n-butyl acetate.

5. The method of claim 4, wherein the applying the solvent contains applying alkyl alcohol:R1-OH, wherein R1 is C1~C7, and wherein R1 represents an alkyl group.

6. The method of claim 4, wherein the applying the solvent contains applying alkyl ester:R2COOR3, wherein R2 and R3 are C2~C6, and wherein R2 and R3 each represent an alkyl group.

7. The method of claim 1, wherein the primer material is further configured to increase a number of deprotected acid labile group (ALG) units of the photoresist pattern.

8. The method of claim 1, wherein the applying of the primer material comprises applying an acid.

9. The method of claim 8, wherein the applying the acid comprises applying a sulfonic acid, a sulfuric acid, a hydrochloric acid, or an acetic acid.

10. The method of claim 8, further comprising: baking the primer material and the photoresist pattern before the shrink material is coated.

11. The method of claim 1, wherein the applying of the primer material comprises applying a polymer that is configured to bond with an acid labile group (ALG) unit of the photoresist pattern.

12. The method of claim 1, wherein the applying of the primer material comprises applying a material having a methylacrylate platform.

13. The method of claim 12, wherein the material having a methylacrylate platform includes a polymer that contains a carboxyl group, an amide group, or an amino group.

14. The method of claim 1, wherein the forming the photoresist pattern is performed using a negative-tone photoresist material.

15. A method of fabricating a semiconductor device, comprising:
    forming a photoresist layer over a patternable layer, the photoresist layer containing a negative tone photoresist material;
    performing an exposure process to the photoresist layer;
    performing a post-exposure bake (PEB) process to the photoresist layer;
    rinsing, using a developer, the photoresist layer to develop a photoresist pattern;
    after the rinsing, applying a primer material to the photoresist pattern and baking the primer material, wherein the primer material is different from the developer and is configured to:
        increase a number of deprotected acid labile group (ALG) units of the photoresist material; or
        bond with the deprotected ALG units of the photoresist material;
    after the applying of the primer material, enlarging the photoresist pattern by coating a shrink material over the photoresist pattern, baking the shrink material, and removing portions of the shrink material; and
    patterning the patternable layer using the enlarged photoresist pattern as a mask.

16. The method of claim 15, wherein the applying of the primer material comprises applying a material that includes alkyl alcohol:R1-OH, wherein R1 is C1~C7, or alkyl ester:R2COOR3, wherein R2 and R3 are C2~C6, and wherein R1, R2, and R3 each represent an alkyl group.

17. The method of claim 15, wherein the applying of the primer material comprises applying a sulfonic acid, a sulfuric acid, a hydrochloric acid, or an acetic acid, and further comprising: baking the primer material and the photoresist pattern before the shrink material is coated.

18. The method of claim 15, wherein the applying of the primer material comprises applying a polymer that contains a carboxyl group, an amide group, or an amino group, wherein the carboxyl group, an amide group, or an amino group are each capable of bonding with the deprotected ALG units of the photoresist material.

19. A method of fabricating a semiconductor device, comprising:
 forming a photoresist layer over a material layer, the photoresist layer containing a negative tone photoresist material;
 performing an exposure process to the photoresist layer;
 performing a post-exposure bake (PEB) process to the photoresist layer;
 rinsing the photoresist layer to develop a plurality of photoresist patterns separated by a plurality of gaps;
 applying a primer material to the photoresist patterns, wherein the primer material contains:
  a sulfonic acid, a sulfuric acid, a hydrochloric acid, or an acetic acid; or
  a polymer based on a methylacrylate platform;
 after the applying of the primer material, reducing the gaps between the photoresist patterns by coating a shrink material over and between the photoresist patterns, baking the shrink material, and removing portions of the shrink material; and
 performing an etching process to etch away portions of the material layer that are exposed by the reduced gaps.

20. The method of claim 19, wherein the applying of the primer material straightens a profile of each of the photoresist patterns, increases a number of deprotected acid labile group (ALG) units of the photoresist patterns, or bonds the deprotected ALG units of the photoresist patterns with the polymer of the primer material.

* * * * *